US012364164B2

(12) United States Patent
Gottwald et al.

(10) Patent No.: US 12,364,164 B2
(45) Date of Patent: Jul. 15, 2025

(54) REACTIVE SERIAL RESISTANCE REDUCTION FOR MAGNETORESISTIVE RANDOM-ACCESS MEMORY DEVICES

(71) Applicant: INTERNATIONAL BUSINESS MACHINES CORPORATION, Armonk, NY (US)

(72) Inventors: Matthias Georg Gottwald, Ridgefield, CT (US); Guohan Hu, Yorktown Heights, NY (US); Stephen L. Brown, Carmel, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 431 days.

(21) Appl. No.: 18/064,261

(22) Filed: Dec. 10, 2022

(65) Prior Publication Data

US 2024/0196755 A1    Jun. 13, 2024

(51) Int. Cl.
*H10N 50/01* (2023.01)
*G11C 11/16* (2006.01)
(Continued)

(52) U.S. Cl.
CPC .......... *H10N 50/01* (2023.02); *G11C 11/161* (2013.01); *H01F 10/3272* (2013.01);
(Continued)

(58) Field of Classification Search
CPC ........ H10N 50/01; H10N 50/10; H10N 50/80; H10N 50/85; G11C 11/161; H01F 10/3272; H10B 61/00
See application file for complete search history.

(56) References Cited

U.S. PATENT DOCUMENTS 8,299,552 B2 * 10/2012 Nagase ............... H01F 10/3286
257/E29.323
9,048,411 B2    6/2015 Jan et al.
(Continued)

FOREIGN PATENT DOCUMENTS

CN    101399312 A    4/2009
CN    102800804 A    11/2012
(Continued)

OTHER PUBLICATIONS

Fowley, C. et al., "Perpendicular Magnetic Anisotropy in CoFeB/Pd Bilayers"; IEEE Transactions on Magnetics (2010); vol. 46:6., pp. 2116-2118.
(Continued)

*Primary Examiner* — Allison Bernstein
(74) *Attorney, Agent, or Firm* — Yuanmin Cai

(57) ABSTRACT

A semiconductor device that includes a substrate, a crystalline bottom electrode layer on an upper side of the semiconductor substrate, a conductive crystalline metal layer above the crystalline bottom electrode layer, and a conductive oxide layer above the conductive crystalline metal layer. The conductive oxide layer has a low resistance. The semiconductor device also includes a magnetic tunnel junction (MTJ) above the conductive crystalline metal layer, the MTJ including a tunnel barrier layer, a free layer on a first side of the tunnel barrier layer and a reference layer on a second side of the tunnel barrier layer opposite the first side.

20 Claims, 13 Drawing Sheets

(51) Int. Cl.
*H01F 10/32* (2006.01)
*H10B 61/00* (2023.01)
*H10N 50/10* (2023.01)
*H10N 50/80* (2023.01)
*H10N 50/85* (2023.01)

(52) U.S. Cl.
CPC ............. *H10B 61/00* (2023.02); *H10N 50/10* (2023.02); *H10N 50/80* (2023.02); *H10N 50/85* (2023.02)

(56) References Cited

U.S. PATENT DOCUMENTS

| | | | |
|---|---|---|---|
| 9,966,529 | B1 | 5/2018 | Iwata et al. |
| 10,840,297 | B2 | 11/2020 | Tahmasebi et al. |
| 10,937,946 | B2 | 3/2021 | Wang et al. |
| 11,417,835 | B2 | 8/2022 | Iwata et al. |
| 11,837,288 | B2 * | 12/2023 | Matsushita ........ G11C 13/0026 |
| 12,217,775 | B2 * | 2/2025 | Inubushi ............ G01R 33/0052 |
| 2009/0079018 | A1 | 3/2009 | Nagase |
| 2012/0300541 | A1 | 11/2012 | Higo |
| 2015/0076485 | A1 | 3/2015 | Sandhu et al. |
| 2015/0129996 | A1 | 5/2015 | Tang et al. |
| 2016/0072045 | A1 * | 3/2016 | Kanaya .................. H10N 50/10 257/427 |
| 2017/0317274 | A1 | 11/2017 | Seino |
| 2019/0189917 | A1 | 6/2019 | Honjo |
| 2019/0207091 | A1 | 7/2019 | Kardasz et al. |
| 2022/0223783 | A1 | 7/2022 | Jeong |

FOREIGN PATENT DOCUMENTS

| | | |
|---|---|---|
| CN | 114765245 A | 7/2022 |
| TW | 201639178 A | 11/2016 |
| WO | 2010/026802 A1 | 3/2010 |

OTHER PUBLICATIONS

International Search Report and Written Opinion issued Feb. 15, 2024 in related International Patent Application No. PCT/IB2023/061672, 13 pgs.

\* cited by examiner

REACTIVE SERIAL RESISTANCE REDUCTION FOR MAGNETORESISTIVE RANDOM-ACCESS MEMORY DEVICES

BACKGROUND

Technical Field

The disclosure relates generally to structures and methods of fabrication of semiconductor devices including magnetoresistive random-access memory (MRAM). More particularly, the disclosure relates to structures and methods of fabrication of semiconductor devices including a magnetic tunnel junction (MTJ) with an ordered alloy layer that forms the reference layer and/or free layer of the MTJ.

Description of the Related Art

MRAM cells exploit the quantum mechanical effect of electron tunneling through an insulating layer disposed between two ferromagnetic layers, a free layer and a reference layer. The tunnel magnetoresistance (TMR) of the MRAM cell can be switched between a first state of low resistance where the two ferromagnetic layers have parallel magnetic dipole moments, and a second state of high resistance, where the two ferromagnetic layers have antiparallel magnetic dipole moments. Switching the free layer magnetic dipole moment is accomplished by altering the magnetic dipole moment of the free ferromagnetic layer of the MRAM cell. The alteration occurs when a write current is passed through the MRAM cell stack.

For a standard connected MRAM cell stack the TMR can be calculated as the AP state resistance minus the parallel state resistance, divided by the parallel state resistance plus any circuit parasitic series resistances. Parasitic series resistances arise from the circuit elements disposed between the MRAM cell stack and the associated access transistor. The resistance increases with the distance between the MRAM cell stack and the transistor due to increasing amount of material through which the write currents pass. In reading an MRAM cell, a known voltage is applied to the cell and the current through the cell is detected. Each of the AP and P states results in a different current. The greater the TMR, the greater the difference between the two read currents and higher the degree of sensing performance for the MRAM cell.

Typical MRAM cells may comprise an array of MTJs that are connected by bit lines and word lines to form the circuitry. Seed layer structures for bottom free layers for MTJ stacks face some challenges including magnetic alloys like Heusler materials involving highly textured and ordered seed layer materials. Further, good retention vs. write current trade-offs involve device free layers to be grown on a leaky oxide layer to reduce spin pumping, while avoiding the addition of series resistance to the device.

SUMMARY

According to an embodiment of the disclosure, a semiconductor device is provided. The semiconductor device includes a substrate extending along a first axis to define a length, a second axis orthogonal to the first axis to define a width, and a third axis orthogonal to the first and second axes to define a height. There is also a crystalline bottom electrode layer on an upper side of the semiconductor substrate, a conductive crystalline metal layer above the crystalline bottom electrode layer, and a conductive oxide layer above the conductive crystalline metal layer. The conductive oxide layer has a low resistance as described herein. There is a magnetic tunnel junction (MTJ) above the conductive crystalline metal layer, the MTJ including a tunnel barrier layer, a free layer on a first side of the tunnel barrier layer and a reference layer on a second side of the tunnel barrier layer opposite the first side. As a result, a structure for advanced MRAM devices as well as memory and cache for server chips may be obtained. Moreover, the semiconductor device may be readily detectable due to trace elements in the conductive oxide layer.

In one embodiment, the free layer is an ordered alloy.

In one embodiment, the reference layer is an ordered alloy.

In one embodiment, the conductive oxide layer is a shunted MgO layer and further includes a material such as, Lithium (Li), Aluminum (Al), Scandium (Sc), or other rare earth metals such as Gadolinium (Gd), or Yttrium (Y).

In one embodiment, the ordered alloy is a Heusler alloy or a tetragonal material.

In one embodiment, a method of fabricating a semiconductor device is disclosed. The method includes depositing an amorphous bottom electrode layer on a semiconductor substrate. A conductive amorphous metal layer is deposited on the amorphous bottom electrode layer. An amorphous reactive material is deposited on the conductive amorphous metal layer. An insulating oxide layer is deposited on the amorphous reactive template. An ordered alloy structure that includes a free layer or a reference layer is deposited on the insulating oxide layer. A tunnel barrier layer is subsequently deposited on the ordered alloy structure, and a stack annealing process is performed on the semiconductor device. During the stack annealing process, the amorphous reactive material reacts with and shunts the insulating oxide layer to form a conductive oxide layer. The conductive amorphous metal layer is initially deposited as an amorphous structure and becomes crystalline after the stack annealing process. Likewise, the amorphous bottom electrode layer may initially be deposited as an amorphous structure and may become crystalline after the stack annealing process. Advantageously, advanced MRAM devices as well as memory and cache for server chips may be formed from this method and associated series resistances introduced in MRAM stacks from relatively thick insulating oxide layers may be significantly reduced.

In one embodiment, the ordered alloy structure includes a base/seed layer, and the method includes depositing the base/seed layer on the insulating oxide layer prior to depositing the free layer or the reference layer on the base/seed layer.

In one embodiment, the free layer is deposited on the base/seed layer, and subsequent to depositing the free layer on the base/seed layer and the tunnel barrier layer on the free layer, another conductive amorphous metal layer is deposited on the tunnel barrier layer, a synthetic antiferromagnetic (SAF) layer is deposited on the other conductive amorphous metal layer, and the reference layer is deposited on the SAF to provide a bottom free layer MTJ device.

In one embodiment, the reference layer is deposited on the base/seed layer. Subsequent to depositing the reference layer on the base/seed layer and the tunnel barrier layer on the reference layer, the free layer is deposited on the tunnel barrier layer. An oxide cap layer is deposited on the free layer, and a top electrode layer is deposited on the oxide cap layer to provide a top free layer MTJ device.

The techniques described herein may be implemented in a number of ways. Example implementations are provided below with reference to the following figures.

BRIEF DESCRIPTION OF THE DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all the components or steps that are illustrated. When the same numeral appears in different drawings, it refers to the same or like components or steps.

DETAILED DESCRIPTION

Overview

Figure 1:
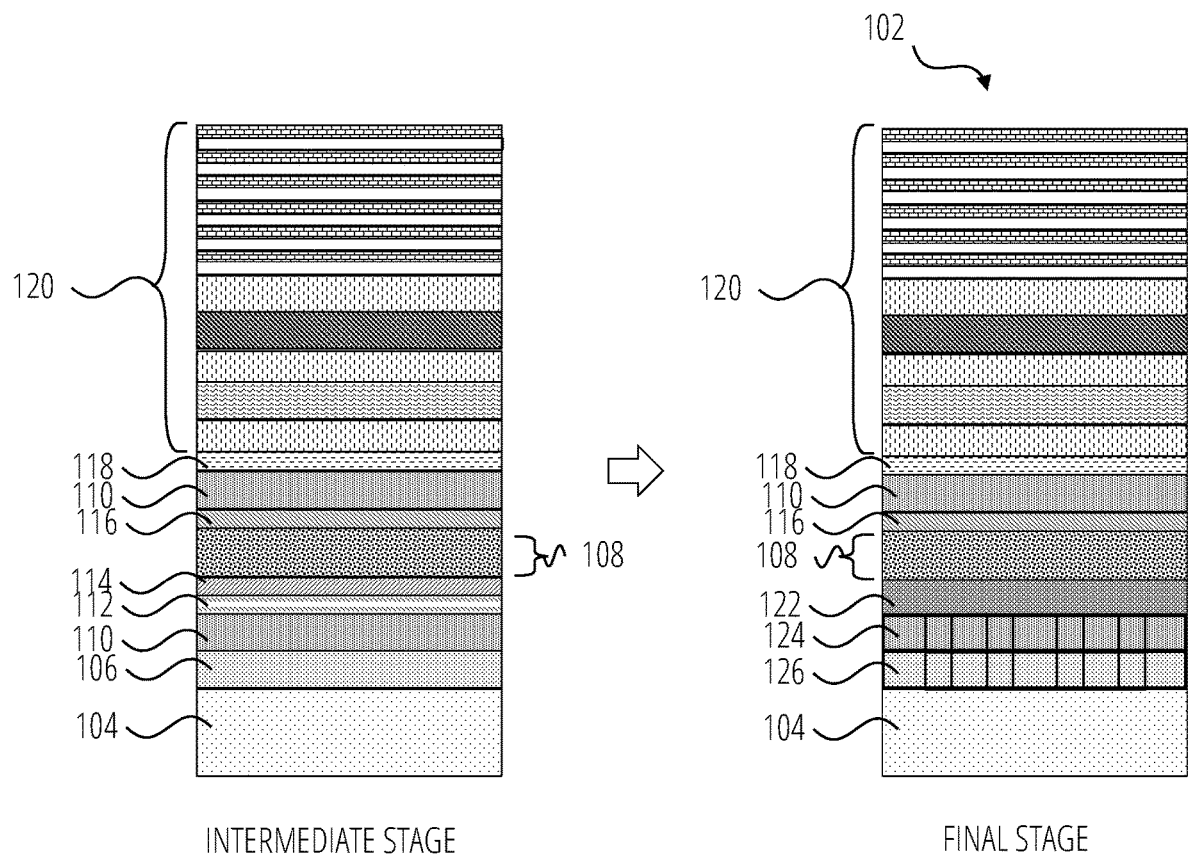
FIG. 1 depicts cross section views of a semiconductor device in an intermediate and final stage illustrating an ordered alloy free layer configuration, in accordance with an illustrative embodiment.

In the following detailed description, numerous specific details are set forth by way of examples to provide a thorough understanding of the relevant teachings. However, it should be apparent that the present teachings may be practiced without such details. In other instances, well-known methods, procedures, components, and/or circuitry have been described at a relatively high-level, without detail, to avoid unnecessarily obscuring aspects of the present teachings.

In one aspect, spatially related terminology such as "front," "back," "top," "bottom," "beneath," "below," "lower," above," "upper," "side," "left," "right," and the like, is used with reference to the orientation of the Figures being described. Since components of embodiments of the disclosure can be positioned in a number of different orientations, the directional terminology is used for purposes of illustration and is in no way limiting. Thus, it will be understood that the spatially relative terminology is intended to encompass different orientations of the device in use or operation in addition to the orientation depicted in the figures. For example, if the device in the figures is turned over, elements described as "below", or "beneath" other elements or features would then be oriented "above" the other elements or features. Thus, for example, the term "below" can encompass both an orientation that is above, as well as below. The device may be otherwise oriented (rotated 90 degrees or viewed or referenced at other orientations) and the spatially relative descriptors used herein should be interpreted accordingly.

As used herein, the terms "lateral" and "horizontal" describe an orientation parallel to a first surface of a chip.

As used herein, the term "vertical" describes an orientation that is arranged perpendicular to the first surface of a chip, chip carrier, or semiconductor body.

As used herein, the terms "coupled" and/or "electrically coupled" are not meant to mean that the elements must be directly coupled together-intervening elements may be provided between the "coupled" or "electrically coupled" elements. In contrast, if an element is referred to as being "directly connected" or "directly coupled" to another element, there are no intervening elements present. The term "electrically connected" refers to a low-ohmic electric connection between the elements electrically connected together.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

Example embodiments are described herein with reference to cross-sectional illustrations that are schematic illustrations of idealized or simplified embodiments (and intermediate structures). As such, variations from the shapes of the illustrations as a result, for example, of manufacturing techniques and/or tolerances, may be expected. Thus, the regions illustrated in the figures are schematic in nature and their shapes do not necessarily illustrate the actual shape of a region of a device and do not limit the scope.

It is to be understood that other embodiments may be used, and structural or logical changes may be made without departing from the spirit and scope defined by the claims. The description of the embodiments is not limiting. In particular, elements of the embodiments described hereinafter may be combined with elements of different embodiments.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

The fabrication of the structures discussed herein can comprise multi-step sequences of, for example, photolithographic and/or chemical processing steps that facilitate gradual creation of electronic-based systems, devices, components, and/or circuits in a semiconducting and/or a superconducting device (e.g., an integrated circuit). For instance, devices herein can be fabricated on one or more substrates (e.g., a silicon (Si) substrates, and/or another substrate) by employing techniques including, but not limited to: photolithography, microlithography, nanolithography, nanoimprint lithography, photomasking techniques, patterning techniques, photoresist techniques (e.g., positive-tone photoresist, negative-tone photoresist, hybrid-tone photoresist, and/or another photoresist technique), etching techniques (e.g., reactive ion etching (RIE), dry etching, wet etching, ion beam etching, plasma etching, laser ablation, and/or another etching technique), evaporation techniques, sputtering techniques, plasma ashing techniques, thermal treatments (e.g., rapid thermal anneal, furnace anneals, thermal oxidation, and/or another thermal treatment), chemical vapor deposition (CVD), atomic layer deposition (ALD), physical vapor deposition (PVD), molecular beam epitaxy (MBE), electrochemical deposition (ECD), chemical-mechanical planarization (CMP), backgrinding techniques, and/or another technique for fabricating an integrated circuit.

Turning now to an overview of technologies that generally relate to the present teachings, MRAM devices store data bits using magnetic states enabled by a pair of ferromagnetic metal plates separated by a thin insulating material layer. The two plates and insulating layer form an MTJ with one plate, the reference layer, being fixed because its magnetic direction does not change and the other plate, the free layer, being changeable, because its magnetic direction may change when bias is applied to the MTJ. MRAM devices may include a seed layer on which the free layer is grown. Seed layer structures for bottom free layers of MTJ stacks may face some challenges including magnetic alloys like Heusler materials, which can be used as ordered alloys in MRAM devices, requiring highly textured and ordered seed layer materials. Further good retention vs. write current trade-offs may involve device free layers to be grown on a leaky oxide layer to reduce spin pumping, while avoiding the addition of series resistance to the device. Series resistances may increase with increasing thickness of the oxide layer. A thin oxide layer such as an MgO based oxide (<2 unit cells of MgO thick, ~ 0.8 nm) may be leaky and prevent spin pumping in a reasonable way to lower write currents. However, its texture and crystalline ordering might be insufficient for template growth of additional seed layers or ordered magnetic alloys. A comparatively thicker oxide layer such as an MgO based oxide (>2 unit cells thick, ~ 0.8 nm) may have a higher degree of texture and ordering and may induce targeted crystalline symmetry and ordering of additional seed layers or of an ordered magnetic alloy. The comparatively thicker oxide layer may also be efficient at preventing spin pumping but may act as a second tunnel barrier in series with the main tunnel barrier and therefore add resistance, lower read signals and increase write voltages. Even further, highly ordered magnetic alloys may be good candidates for reference layers for magnetic tunnel junction stacks (a thick MgO seed layer may be an ideal layer to template the growth of, for example, Co—Pt with $L1_0$ symmetry). However, this may also generate series resistance that may hamper device performance if not prevented.

Various non-limiting embodiments of the present disclosure provide fabrication methods and resulting semiconductor devices that implement an ordered alloy MTJ structure having a conductive oxide layer, such as a conductive MgO layer, wherein the ordered alloy forms the free layer and/or the reference layer. An ordered alloy has a defined crystalline structure and comprises at least two types of atoms, which alternate in position with some regularity. Disposed below the ordered alloy layer may be a conductive oxide layer (e.g., a conductive MgO layer formed by a reaction between an amorphous reactive material and an insulating oxide layer, e.g., an MgO material prior to the reaction). Disposed above the ordered alloy layer may be a tunnel barrier layer that comprises, for example, an MgO layer. The insulating oxide layer may be desired to be much thicker than a few atomic monolayers (e.g., between 10-50A), during stack deposition, to develop a good crystallinity and texture. The crystalline insulating oxide layer acts as template/seed for the ordered alloy layer deposited subsequently. The illustrative embodiments dispose, during stack deposition, the amorphous reactive material underneath the insulating oxide layer to increase the effective thickness of the insulating oxide layer. However, after stack deposition, the presence of a thick insulating oxide layer may not be needed. The associated increased series resistance of the device brought on by the thick insulating oxide layer may lead to decreased performance of the MRAM device. The illustrative embodiments disclose a stack annealing post-processing routine wherein the associated series resistance of the device may be significantly reduced by a reaction between the amorphous reactive material and the insulating oxide layer, which reaction results in the formation of the conductive oxide layer having a relatively low resistance. As a result, the associated series resistance of the device may be reduced, the growth of free layer or reference layer materials during deposition may be improved and thicker grading layers may be formed to lattice fit advanced free layer/reference layer materials.

Example Architecture

FIG. 1 illustrates cross section views of a semiconductor device in an intermediate and a final stage of an ordered alloy free layer configuration, consistent with an illustrative embodiment. The semiconductor device 102 comprises a semiconductor substrate 104 extending along a first axis (e.g., X-axis) to define length, a second axis (e.g., Y-axis) orthogonal to the X-axis to define a width, and a third axis (e.g., Z-axis) orthogonal to the first and second axes to define a height. The semiconductor substrate 104 can be formed from a semiconductor material such as, for example, silicon (Si).

The term "semiconductor material" is used throughout the present application to denote a material that has semiconducting properties. The semiconductor material may be any suitable substrate material, such as, for example, monocrystalline Silicon, silicon germanium alloy (SiGe), III-V compound semiconductor, II-VI compound semiconductor, or semiconductor-on-insulator (SOI). Group III-V compound semiconductors, for example, include materials having at least one group III element and at least one group V element, such as one or more of aluminum gallium arsenide (AlGaAs), aluminum gallium nitride (AlGaN), aluminum arsenide (AlAs), aluminum indium arsenide (AlIAs), aluminum nitride (AlN), gallium antimonide (GaSb), gallium aluminum antimonide (GaAlSb), gallium arsenide (GaAs), gallium arsenide antimonide (GaAsSb), gallium nitride (GaN), indium antimonide (InSb), indium arsenide (InAs), indium gallium arsenide (InGaAs), indium gallium arsenide phosphide (InGaAsP), indium gallium nitride (InGaN), indium nitride (InN), indium phosphide (InP) and alloy combinations including at least one of the foregoing materials. The alloy combinations can include binary (two elements, e.g., gallium (III) arsenide (GaAs)), ternary (three elements, e.g., InGaAs) and quaternary (four elements, e.g., aluminum gallium indium phosphide (AlInGaP)) alloys.

The semiconductor device 102 may further comprise, in an intermediate stage, an amorphous bottom electrode layer 106 deposited on an upper side of the semiconductor substrate 104. The amorphous bottom electrode layer 106 can be formed from depositing an amorphous material such as amorphous Ta(N) deposited by chemical vapor deposition (CVD), physical vapor deposition (PVD) or similar methods. The amorphous material may crystallize after an annealing process described herein.

As shown in the figure, the deposition further includes a succession of layers deposited upon the amorphous bottom electrode layer 106 to form vertical magnetic-tunnel junction (MTJ) stacks of MRAM cells. In an embodiment, the illustrated MTJ stack includes a simplistically depicted MTJ formed from the amorphous bottom electrode layer 106, the reference layer 120 (i.e., a layer having a fixed magnetic dipole moment), a tunnel barrier layer 116, and a free layer 206 (a layer having a switchable magnetic dipole moment, shown in FIG. 2), wherein the free layer 206 and the reference layer 120 may have perpendicular magnetic anisotropy.

More specifically, a conductive amorphous metal layer 110 is deposited above the amorphous bottom electrode layer 106 and can comprise an amorphous material such as a Cobalt-Iron-boron alloy (CoFeB), or a Zirconium-Cobalt (ZrCo) alloy. A conductive oxide layer 122 with a low resistance (for example, a resistance area product (RA) of less than 0.5 Ohm $\mu m^2$Ohm times micrometer square) may be formed above the conductive amorphous metal layer 110 by a reaction between an amorphous reactive material 112 and an insulating oxide layer 114 as a result of a stack annealing process discussed herein. The low resistance may provide that the conductive oxide layer has a negligible impact on the overall resistance of the device. During stack anneal in post processing, the amorphous reactive material 112 reacts with the insulating oxide layer 114, making it more conductible. In the stack annealing process, the annealing temperature may be maintained at, for example, 300-425° C. for a defined time period (for example, for 30 s to 10 hours, or 60-120 minutes) before cooling. This reaction shorts the insulating oxide layer 114 reducing its insulating properties and thus, significantly reducing the series resistance of the stack. For example, the resistance area product may be reduced from range>1 Ohm $\mu m^2$ (or typically 10-1000 Ohm $\mu m^2$) to below 0.5 Ohm $\mu m^2$ (or below <0.1 Ohm $\mu m^2$) As a result, the amorphous reactive material 112 may be substantially (e.g., completely) consumed, leaving the conductive crystalline metal layer 124 to be disposed directly below the newly formed conductive oxide layer 122. More specifically, the conductive amorphous metal layer 110 and the amorphous bottom electrode layer 106 become a conductive crystalline metal layer 124 and a crystalline bottom electrode layer 126 respectively after the stack annealing process (for example, amorphous CoFeB becomes crystalline CoFe). In various embodiments, the conductive oxide layer 122 can have a thickness of 1.5-3 nm.

In one or more non-limiting embodiments, the amorphous reactive material 112 comprises Lithium-Boron (LiB), Aluminum-Boron (AlB), Scandium-Boron (ScB) or other reactive rare earth metal boron alloys (e.g., Erbium Boron (Er—B), Samarium-Boron (Sa—B)). The boron in the alloy may ensure that the reactive material stays amorphous during and after the deposition. Alternatively, the reactive material can be alloyed into or on top of the conductive amorphous metal layer 110. For example, for a conductive amorphous metal layer 110 comprising CoFeB, an additional CoFeLiB, CoFeAlB or CoFeScB layer may be formed atop the original CoFeB layer or the reactive material may be alloyed directly into the original CoFeB layer. The alloy may be CoFe-X-B, with a boron content of 40 to 60%. From the remaining 40-60% of the CoFeX alloy metal, X can be 10-60% or 25-45%. The high boron amount is needed to ensure the complex alloy stays amorphous and has no magnetic moment.

The semiconductor device 102 may further comprise an MTJ that includes a tunnel barrier layer 116, a free layer 206 disposed on a first side of the tunnel barrier layer 116 and a reference layer 120 disposed on a second side of the tunnel barrier layer opposite the first side. The tunnel barrier layer 116 can include a non-magnetic insulating material such as magnesium oxide (MgO). The free layer 206 can be formed from an ordered alloy to provide an ordered alloy free layer. Likewise, the reference layer 120 can be formed from an ordered alloy to provide an ordered alloy reference layer. Thus, in the semiconductor device 102, at least one of the free layer 206 and the reference layer 120 can comprise an ordered alloy.

Figure 2:
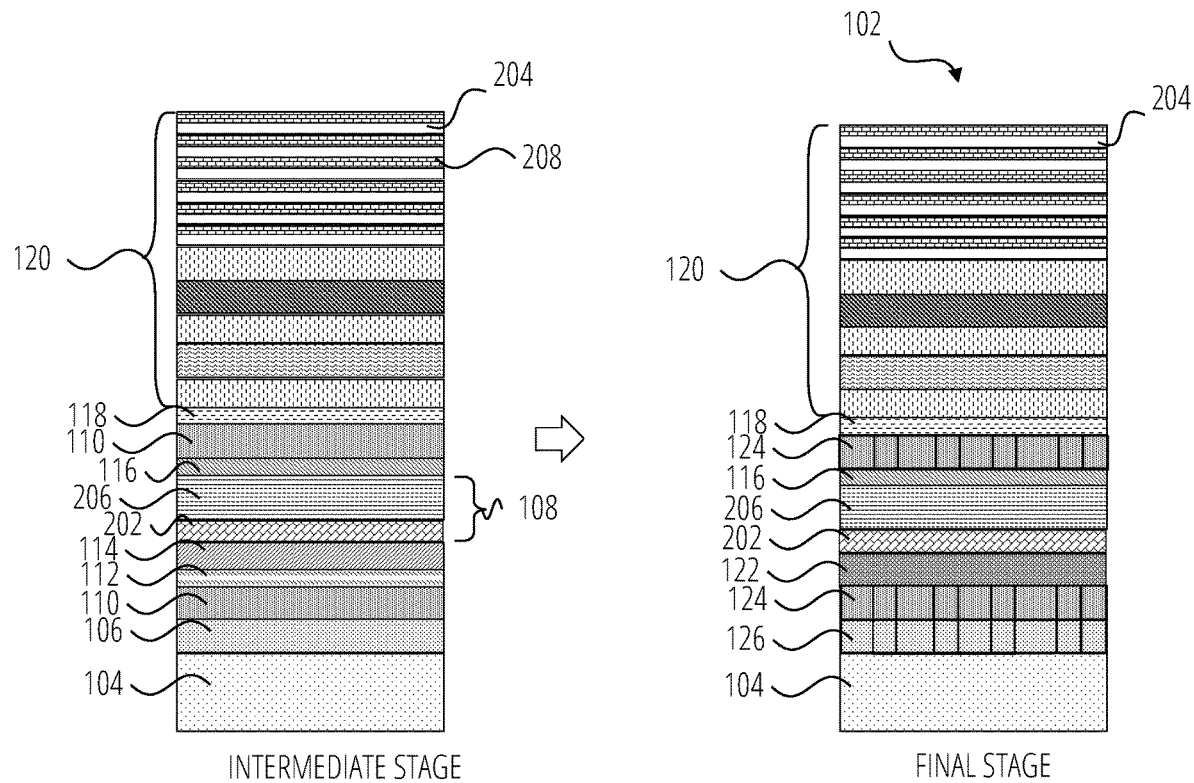
FIG. 2 depicts cross section views of a semiconductor device in an intermediate and final stage illustrating a bottom free layer MTJ device with an ordered alloy free layer configuration, in accordance with an illustrative embodiment.
Figure 3:
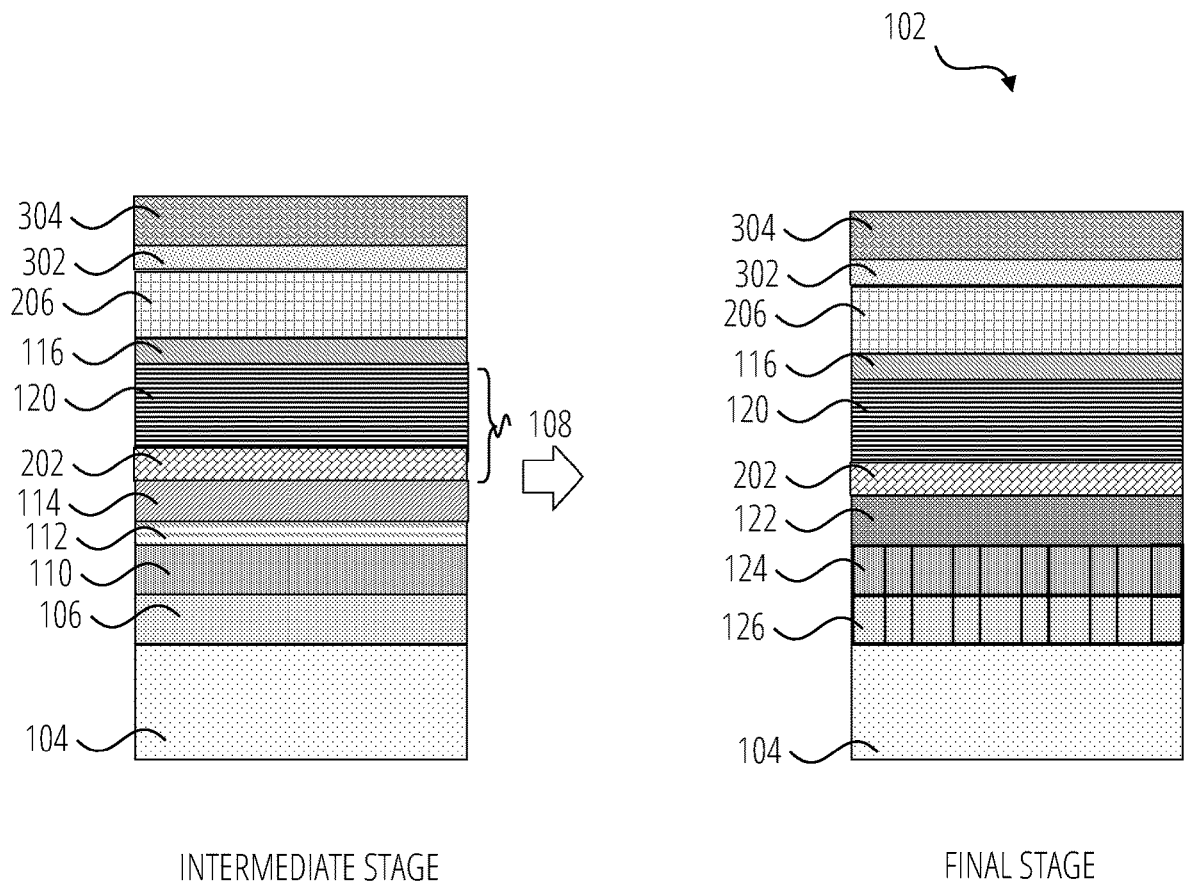
FIG. 3 depicts cross section views of a semiconductor device in an intermediate and final stage illustrating a top free layer MTJ device with an ordered alloy reference layer configuration, in accordance with an illustrative embodiment.

Further, an ordered alloy structure 108 may comprise a free layer 206 and a corresponding template or otherwise base/seed layer 202 of the free layer 206 (as shown in FIG. 2). The ordered alloy structure 108 can likewise comprise a reference layer 120 and a corresponding base/seed layer 202 of the reference layer 120 as shown in FIG. 3. More specifically, ordered alloy layers of the ordered alloy structure 108 may involve seeding, template or wetting layers to grow onto an insulating oxide layer/lattice. In one or more embodiments, the base/seed layer 202 can be CoAl.

In one or more embodiments, ordered alloys can be Heusler alloys or tetragonal materials such as AlMnGe. Heusler alloys may include, for example, $Mn_3Al$, $Mn_2CoSi$, $Mn_2CoAl$, $Mn_2CoAl$, $Mn_2CuSi$, $Mn_2CoGe$, $Mn_2MnAl$, $Co_2CrAl$, $Mn_2FeSb$, $Mn_2CoSi$, $Co_2CrGe$, $Co_2CrSi$, $Co_2MnSi$, $Co_2MnSb$, $Co_2MnGe$, $Mn_2CoAs$, $Mn_2FeAs$, $Fe_2MnSi$, or $Mn_2MnAs$.

Turning to FIG. 2, cross section views of a semiconductor device in an intermediate and a final stage are shown. The final stage shows the semiconductor device 102 after completion of an annealing process. FIG. 2 illustrates a bottom free layer MTJ device having an ordered alloy free layer configuration in accordance with an illustrative embodiment. In this configuration, the ordered alloy may form the free layer 206 which is disposed below the tunnel barrier layer 116. The reference layer 120 may be disposed above the tunnel barrier layer 116 with a conductive amorphous metal layer 110 and a synthetic antiferromagnetic layer 118 deposited therebetween. The reference layer of FIG. 2 may comprise, for example, one or more interfacial layers, or spacers 204, and other layers 208 such as ruthenium, cobalt, palladium, tantalum, iron, boron, cobalt-platinum or cobalt-palladium, in multilayers or in a mixture.

FIG. 3 depicts cross section views of a semiconductor device in an intermediate and final stage illustrating a top free layer MTJ device with an ordered alloy reference layer configuration in accordance with an illustrative embodiment. The final stage shows the semiconductor device 102 after completion of an annealing process. In this configuration, the locations of the reference layer and free layer are reversed, yielding a reversed structure MRAM cell. The ordered alloy may form the reference layer 120, which is disposed below the tunnel barrier layer 116. The free layer 206 may be disposed above the tunnel barrier layer 116 with an oxide cap layer 302 and a top electrode layer 304 successively disposed thereafter. The oxide cap later 302 may cut out spin pumping. In this embodiment, the free layer 206 may include, for example, cobalt-iron-boron alloy (CoFeB), and the reference layer may include, for example, $Mn_3Ge$. In one or more embodiments, the reference layer can be any ordered alloy (Heusler or tetragonal) having a high perpendicular magnetic anisotropy (PMA), for example PMA>1 Tesla, a low moment with a with high spin polarization and a low magnetization (for example<600 emu/$cm^3$). In one or more embodiments, the free layer can be any free layer design, i.e., a structure such as CoFeB, Co, Fe etc. Alternatively, the free layer can be an ordered alloy free layer.

Top electrode layer 304 may include TaN or TiN or similar materials. The respective layers may be formed by CVD, PVD, or similar methods. Of course, these examples are not meant to be limiting, as other configurations may be obtained in view of the descriptions and figures. For example, a semiconductor device may have both the reference layer and the free layer comprise an ordered alloy.

Reference is now made to FIG. 4-FIG. 9. The figures provide schematic cross-sectional illustration of an exemplary semiconductor device or MRAM cell stack at intermediate stages of fabrication, according to one or more embodiments of the invention. The figures provide a front cross-section taken along the X-Z plane. The figures provide schematic representations of the devices of the disclosure and are not to be considered accurate or limiting with regards to device element scale.

Figure 4:
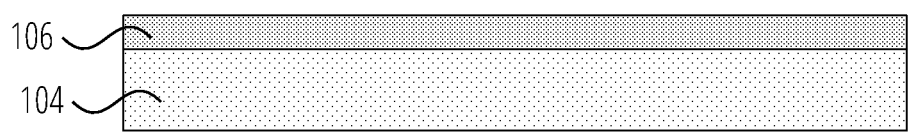
FIG. 4 depicts cross section views of a semiconductor device illustrating a starting substrate with an amorphous bottom electrode layer, in accordance with an illustrative embodiment.
Figure 4:
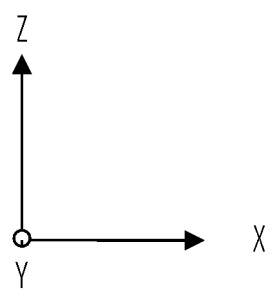

FIG. 4 illustrates the semiconductor device 102 after the deposition of an amorphous bottom electrode layer 106 on the semiconductor substrate 104. The amorphous bottom electrode layer 106 may be a Ta(N) layer.

Figure 5:
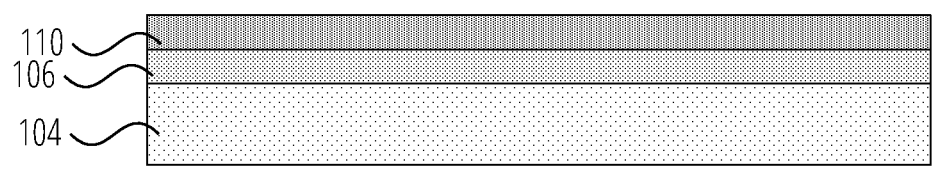
FIG. 5 depicts cross section views of the semiconductor device after applying various fabrication processes on the starting substrate and amorphous bottom electrode layer in accordance with an illustrative embodiment.

As shown in FIG. 5, a conductive amorphous metal layer 110 is deposited on the amorphous bottom electrode layer 106. The conductive amorphous metal layer 110 may comprise, for example, CoFeB. Further, the amorphous bottom electrode layer 106 and the conductive amorphous metal layer 110 may be amorphous at this state of deposition.

Figure 6:
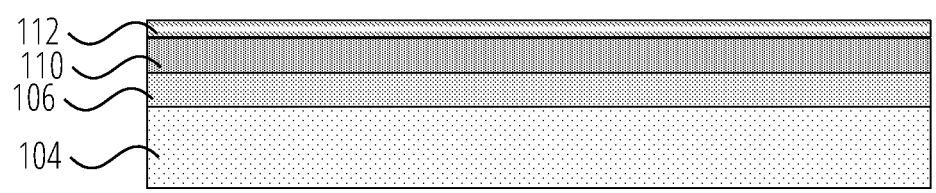
FIG. 6 depicts cross section views of the semiconductor device following an amorphous reactive material deposition, in accordance with an illustrative embodiment.

Turning to FIG. 6, an amorphous reactive material 112 is deposited, the amorphous reactive material 112 may comprise LiB, AlB, ScB or other rare earth boron alloy. The boron in the alloy may ensure that the reactive material stays amorphous during and after deposition.

Figure 7:
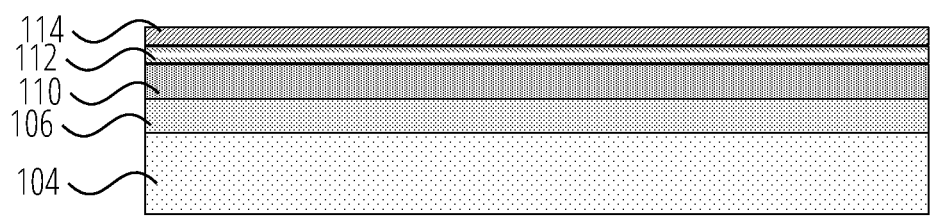
FIG. 7 depicts cross section views of the semiconductor device following an insulating oxide layer deposition, in accordance with an illustrative embodiment.

As shown in FIG. 7, the insulating oxide layer 114 is deposited following the deposition of the amorphous reactive material 112. As described herein, an example insulating oxide layer 114 can be MgO. When MgO is deposited onto an amorphous surface, it may form (100)-oriented crystallites by itself. During stack deposition, the bottom MgO may be desired to be as thick as possible to develop a good crystallinity and texture.

Figure 8:
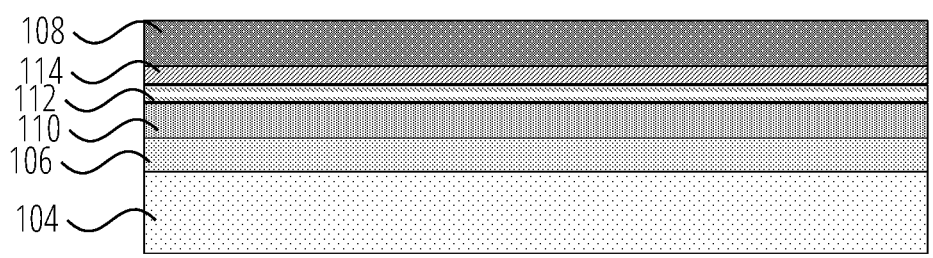
FIG. 8 depicts cross section views of the semiconductor device following an ordered alloy structure deposition, in accordance with an illustrative embodiment.
Figure 9:
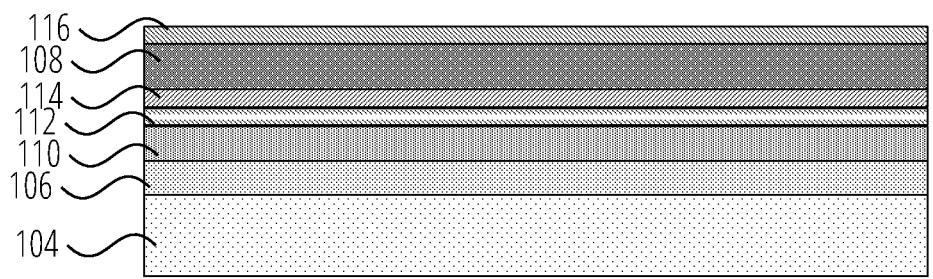
FIG. 9 depicts cross section views of the semiconductor device following a tunnel barrier layer deposition, in accordance with an illustrative embodiment.

Turning to FIG. 8, the ordered alloy structure 108 is deposited on the insulating oxide layer 114. In this particular configuration, the ordered alloy structure 108 may comprise a free layer 206 and thus, a bottom free layer MTJ device may be provided. Following the deposition of the ordered alloy structure 108, the tunnel barrier layer 116 is deposited on the ordered alloy structure 108 as shown in FIG. 9.

Figure 10:
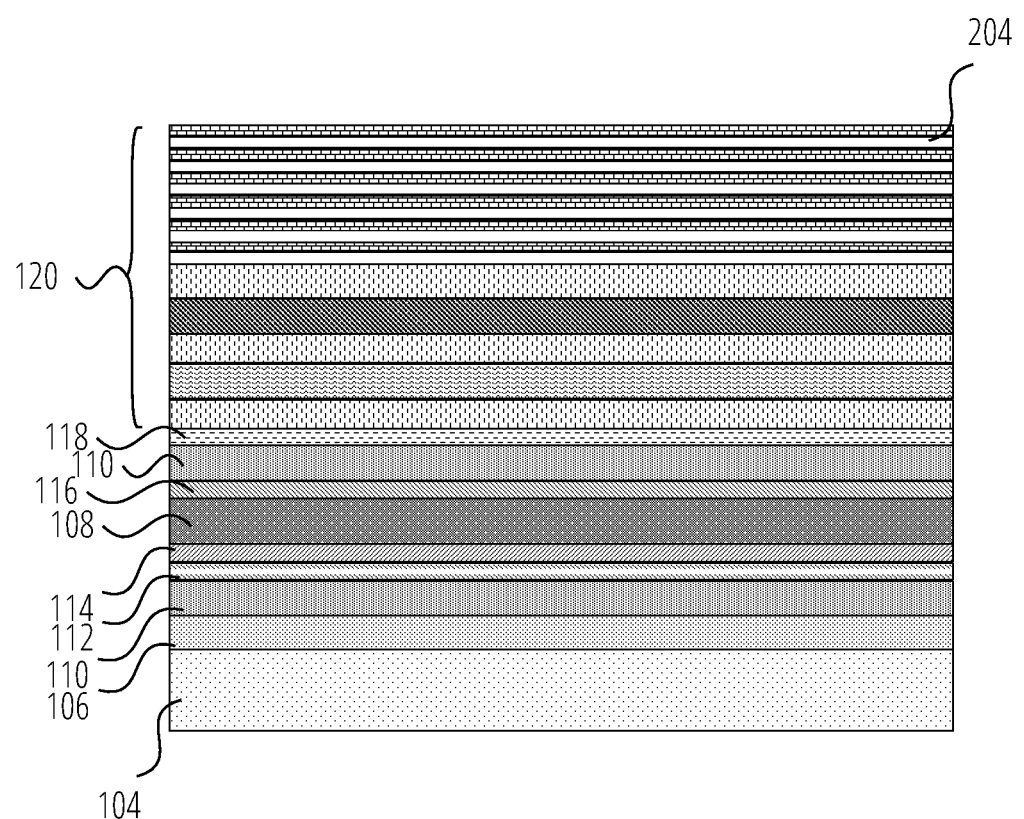
FIG. 10 depicts cross section views of the semiconductor device following a reference layer deposition one or more subsequent fabrication processes in accordance with an illustrative embodiment.

FIG. 10 illustrates the deposition of the conductive amorphous metal layer 110 on the tunnel barrier layer 116, the subsequent deposition of the synthetic antiferromagnetic layer 118 on the conductive amorphous metal layer 110 and the subsequent deposition of the reference layer 120 on the synthetic antiferromagnetic layer 118.

Of course, in another embodiment, the positions of the reference layer 120 and free layer 206 may be switched, wherein the reference layer 120 may be deposited on the insulating oxide layer, and responsive to depositing the reference layer on the insulating oxide layer, the tunnel barrier layer 116 is deposited on the reference layer 120 and the free layer 206 is deposited on the tunnel barrier layer 116. An oxide cap layer 302 may further be deposited on the free layer 206, and a top electrode layer 304 may be deposited on the oxide cap layer 302 to provide a top free layer MTJ device as shown in FIG. 3.

Figure 11:
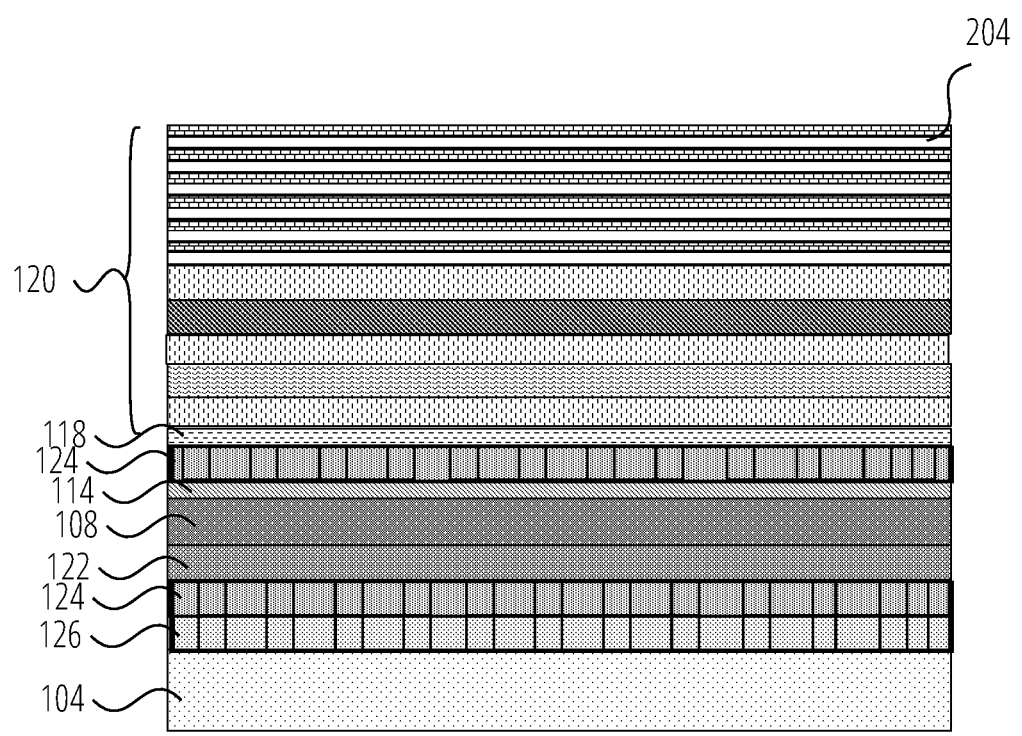
FIG. 11 depicts cross section views of the semiconductor device following a stack annealing process, in accordance with an illustrative embodiment.

Turning now to FIG. 11, a stack annealing process is performed to generate the conductive oxide layer 122 from the amorphous reactive material 112 and insulating oxide layer 114 of FIG. 10. The stack annealing is performed in a post processing routine at a temperature of 300-425° C., wherein the amorphous reactive material 112 reacts with the insulating oxide layer 114, making it relatively conductible. The reaction may result in the shorting of the insulating oxide layer 114 to significantly reduce the series resistance of the MRAM cell stack. After consumption of the amorphous reactive material 112, a conductive crystalline metal layer—to—conductive oxide layer interface, for example a CoFe—MgO interface, may be formed. Forming the conductive oxide layer 122 from the reaction at this stage may be feasible because the insulating oxide layer 114 may have served its purpose as a template and the ordered alloy structure 108 has its desired crystalline structure with the crystallinity of the insulating oxide layer 114 no longer being needed.

Figure 12:
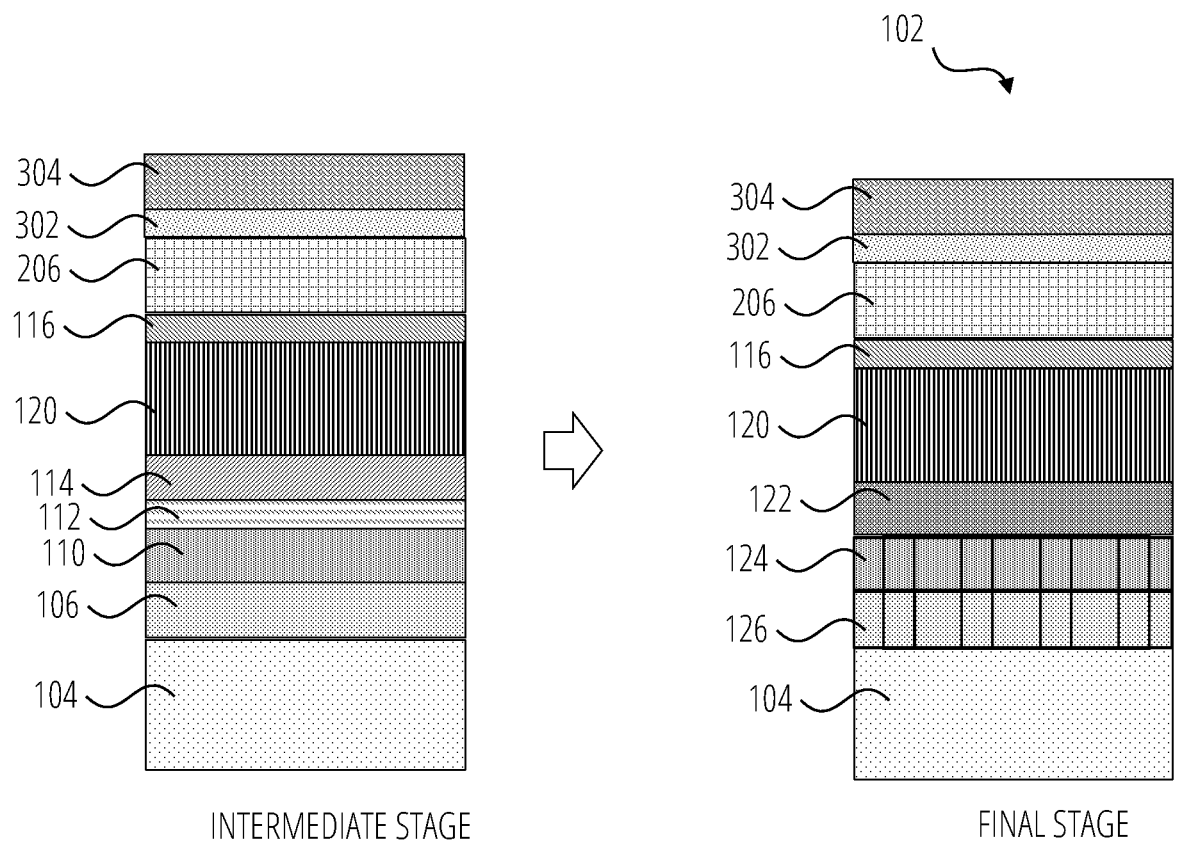
FIG. 12 depicts cross section views of a semiconductor device in an intermediate and final stage illustrating a top free layer magnetic tunnel junction device with an L10 ordered alloy reference layer configuration, in accordance with an illustrative embodiment.

In one or more embodiments, as shown in FIG. 12, the reference layer can be an ordered alloy reference layer. The ordered alloy reference layer can comprise a tetragonal $L1_0$ structure alloy, such as CoPt, CoPd, FePt, FePd or MnAl. As opposed to the configuration of FIG. 3, a base/seed layer is not shown here. Ordered alloy reference layers may benefit from a thick crystalline MgO template. A thick MgO seed layer would be a possible seed layer for the growth of e.g., Co—Pt with $L1_0$ symmetry.

Figure 13:
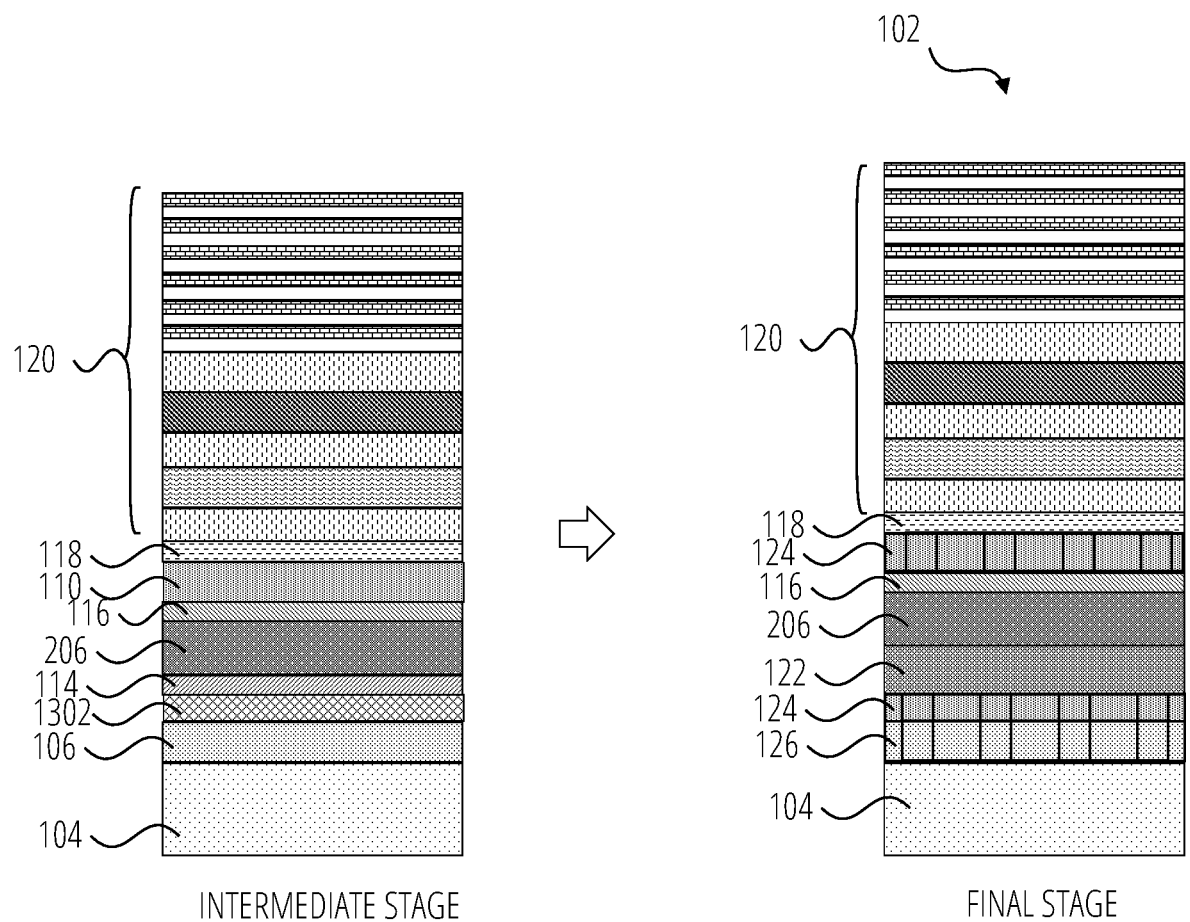
FIG. 13 depicts cross section views of a semiconductor device in an intermediate and final stage illustrating a bottom free layer magnetic tunnel junction device with an ordered alloy free layer configuration, in accordance with an illustrative embodiment.

Turning now to FIG. 13, cross section views of the semiconductor device in an intermediate and final stage illustrating a bottom free layer MTJ device with an ordered alloy free layer configuration is shown. In this example, the amorphous reactive material can be alloyed into the conductive amorphous metal layer to form a reactive material—and—conductive amorphous metal layer alloy 1302. For example, Li, Al, or Sc can be alloyed into a CoFeB alloy, forming a CoFeLiB, CoFeAlB or CoFeScB layer. The amorphous reactive material may react with the insulating oxide layer 114 to form the conductive oxide layer 122, leaving the conductive crystalline metal layer 124 behind. In a specific example, the Sc of a CoFeScB layer may react with an MgO insulating oxide layer, forming a conductive MgO:Sc layer and leaving a CoFe layer behind.

While the manufacture of a semiconductor device or MRAM cell stack with an MTJ is described, it will be understood that other configurations such as SOT-MRAM (spin-orbit torque MRAM), double MTJs, as well as those having a plurality of MRAM cell stacks and MTJs are supported by the teachings herein.

In one aspect, the method and structures as described above may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip may be mounted in a single chip package (such as a plastic carrier, with leads that are affixed to a motherboard or other higher-level carrier) or in a multichip package (such as a ceramic carrier that has either or both surface interconnections or buried interconnections). In any case, the chip can then be integrated with other chips, discrete circuit elements, and/or other signal processing devices as part of either (a) an intermediate product, such as a motherboard, or (b) an end product. The end product can be any product that includes integrated circuit chips, ranging from low-end applications, such as toys, to advanced computer products having a display, a keyboard or other input device, and a central processor.

CONCLUSION

The descriptions of the various embodiments of the present teachings have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

While the foregoing has described what are considered to be the best state and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

The components, steps, features, objects, benefits and advantages that have been discussed herein are merely illustrative. None of them, nor the discussions relating to them, are intended to limit the scope of protection. While various advantages have been discussed herein, it will be understood that not all embodiments necessarily include all advantages. Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

Numerous other embodiments are also contemplated. These include embodiments that have fewer, additional, and/or different components, steps, features, objects, benefits and advantages. These also include embodiments in which the components and/or steps are arranged and/or ordered differently.

While the foregoing has been described in conjunction with exemplary embodiments, it is understood that the term "exemplary" is merely meant as an example, rather than the best or optimal. Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments have more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separately claimed subject matter.

What is claimed is:

1. A semiconductor device comprising:
   a substrate extending along a first axis to define a length, a second axis orthogonal to the first axis to define a width, and a third axis orthogonal to the first and second axes to define a height;
   a crystalline bottom electrode layer on an upper side of the semiconductor substrate;
   a conductive crystalline metal layer disposed above the crystalline bottom electrode layer;
   a conductive oxide layer having a low resistance disposed above the conductive crystalline metal layer; and
   a magnetic tunnel junction (MTJ) disposed above the conductive crystalline metal layer, the MTJ comprising a tunnel barrier layer, a free layer disposed on a first side of the tunnel barrier layer and a reference layer disposed on a second side of the tunnel barrier layer opposite the first side.

2. The semiconductor device of claim 1, wherein the free layer comprises an ordered alloy.

3. The semiconductor device of claim 1, wherein the reference layer comprises an ordered alloy.

4. The semiconductor device of claim 1, wherein the crystalline bottom electrode layer is formed from an amorphous Ta(N) layer.

5. The semiconductor device of claim 1, wherein the low resistance is a resistance area product (RA) of less than 0.5 Ohm $\mu m^2$.

6. The semiconductor device of claim 1, wherein the conductive crystalline metal layer is generated from annealing of an amorphous metal layer comprising CoFeB or ZrCo.

7. The semiconductor device of claim 1, wherein the conductive oxide layer is a shunted MgO layer and further comprises a material selected from the list consisting of Lithium, Aluminum, Scandium and other rare earth metals.

8. The semiconductor device of claim 7, wherein:
the conductive oxide layer comprises the other rare earth metal; and
the other rare earth metal is Gadolinium or Yttrium.

9. The semiconductor device of claim 1, wherein the conductive oxide layer comprises one or more shunting paths and the conductive oxide layer has a thickness of 1.5 nm-3 nm.

10. The semiconductor device of claim 1, wherein an ordered alloy forms the free layer and the reference layer comprises one or more interfacial layers, or spacers, and one or more other layers, each of the one or more other layers comprising a material selected from the list consisting of cobalt, platinum, palladium, ruthenium, tantalum, iron, boron, cobalt-platinum, or cobalt-palladium.

11. The semiconductor device of claim 1, wherein an ordered alloy forms the reference layer and the free layer comprises CoFe.

12. The semiconductor device of claim 11, wherein the ordered alloy is a Heusler alloy or a tetragonal material.

13. A method of fabricating the semiconductor device of claim 1, comprising: depositing an amorphous bottom electrode layer on a semiconductor substrate; depositing a conductive amorphous metal layer on the amorphous bottom electrode layer; depositing an amorphous reactive material on the conductive amorphous metal layer; depositing an insulating oxide layer on the amorphous reactive template; depositing an ordered alloy structure comprising a free layer or a reference layer on the insulating oxide layer; depositing a tunnel barrier layer on the ordered alloy structure; and performing a stack annealing process on the semiconductor device, responsive to which the amorphous reactive material reacts with and shunts the insulating oxide layer to form a conductive oxide layer.

14. The method of claim 13, wherein the ordered alloy structure further comprises a seed layer.

15. The method of claim 14, further comprising:
depositing the seed layer on the insulating oxide layer prior to depositing the free layer or the reference layer on the seed layer.

16. The method of claim 15, wherein:
the free layer is deposited on the seed layer; and
further comprising responsive to depositing the free layer on the seed layer and the tunnel barrier layer on the free layer:
depositing another conductive amorphous metal layer on the tunnel barrier layer;
depositing a synthetic antiferromagnetic (SAF) layer on the another conductive amorphous metal layer; and
depositing the reference layer on the SAF to provide a bottom free layer MTJ device.

17. The method of claim 15, wherein:
the reference layer is deposited on the seed layer; and
further comprising responsive to depositing the reference layer on the seed layer and the tunnel barrier layer on the reference layer:
depositing the free layer on the tunnel barrier layer;
depositing an oxide cap layer on the free layer; and
depositing a top electrode layer on the oxide cap layer to provide a top free layer MTJ device.

18. The method of claim 13, wherein the conductive amorphous metal layer is deposited as a CoFeB or ZrCo layer.

19. The method of claim 13, wherein the amorphous reactive material is deposited as a material selected from the list comprising Lithium Boron alloy (LiB), Aluminum Boron alloy (AlB), Scandium Boron alloy (ScB), and other rare earth boron alloy.

20. The method of claim 13, wherein the stack annealing process is performed at a temperature of 300-425° C.

* * * * *